US009798838B2

United States Patent
Collett et al.

(10) Patent No.: US 9,798,838 B2
(45) Date of Patent: Oct. 24, 2017

(54) METHOD AND SYSTEM FOR DETERMINING FRICTION COEFFICIENT μ FOR AN AIRCRAFT LANDING EVENT

(75) Inventors: Laura Collett, Cheltenham (GB); Kyle R. Schmidt, Charlton Kings (GB); Pia Sartor, Cheltenham (GB)

(73) Assignee: Safran Landing Systems UK LTD (GB)

(*) Notice: Subject to any disclaimer, the term of this patent is extended or adjusted under 35 U.S.C. 154(b) by 1031 days.

(21) Appl. No.: 14/005,500

(22) PCT Filed: Mar. 16, 2012

(86) PCT No.: PCT/GB2012/050580
§ 371 (c)(1),
(2), (4) Date: Nov. 21, 2013

(87) PCT Pub. No.: WO2012/123757
PCT Pub. Date: Sep. 20, 2012

(65) Prior Publication Data
US 2014/0107990 A1 Apr. 17, 2014

(30) Foreign Application Priority Data
Mar. 17, 2011 (GB) .................. 1104515.0

(51) Int. Cl.
*G06F 17/50* (2006.01)
*B64C 25/00* (2006.01)
(Continued)

(52) U.S. Cl.
CPC .......... *G06F 17/5009* (2013.01); *B64C 25/00* (2013.01); *G05B 17/02* (2013.01); *G05B 23/0243* (2013.01); *B64D 2045/008* (2013.01)

(58) Field of Classification Search
None
See application file for complete search history.

(56) References Cited

U.S. PATENT DOCUMENTS 8,818,739 B2 * 8/2014 Zakrzewski ............ B64C 25/00
702/42
2005/0033489 A1 2/2005 Tezuka
(Continued)

FOREIGN PATENT DOCUMENTS

| CA | 2 665 963 | 11/2010 |
| GB | 2470100 | 11/2010 |
(Continued)

OTHER PUBLICATIONS

P. Sartor, et al., "Conceptual Design of a Hard Landing Indication System Using a Flight Parameter Sensor Simulation Model," 27th International Congress of the Aeronautical Sciences 2010, 2010, 12 pages.*

(Continued)

*Primary Examiner* — Aniss Chad
*Assistant Examiner* — David M Rogers
(74) *Attorney, Agent, or Firm* — RatnerPrestia

(57) ABSTRACT

Method and system of determining ground-to-tire friction coefficient for an aircraft landing event. The method uses an aircraft computational model to repeatedly model the landing event, varying one or more initial conditions of the aircraft model until a best match between a modelled value and a provided value of aircraft vertical acceleration is determined. The method uses initial conditions associated with the best match of modelled and provided vertical acceleration values and a strain value from a sensor on the aircraft landing gear, with the ground-to-tire friction coefficient is a variable. The method models the landing gear to generate a modelled strain value and compares this with the measured strain value, and repeats the landing gear modelling step with a different value for the ground-to-tire friction coefficient until a best match between the modelled strain (Continued)

value and the measured strain value is determined and outputting the respective friction coefficient value.

16 Claims, 3 Drawing Sheets

(51) Int. Cl.
*G05B 17/02* (2006.01)
*G05B 23/02* (2006.01)
*B64D 45/00* (2006.01)

(56) References Cited

U.S. PATENT DOCUMENTS

| | | | |
|---|---|---|---|
| 2008/0114506 A1* | 5/2008 | Davis | G05B 23/024 |
| | | | 701/16 |
| 2010/0114411 A1* | 5/2010 | Schmidt | B64C 25/001 |
| | | | 701/16 |
| 2010/0281967 A1 | 11/2010 | Cahill | |
| 2011/0231037 A1* | 9/2011 | Stiharu | B64C 25/00 |
| | | | 701/16 |

FOREIGN PATENT DOCUMENTS

| | | |
|---|---|---|
| WO | WO 2006/130984 | 12/2006 |
| WO | WO 2007/023280 | 3/2007 |
| WO | WO 2010/031179 | 3/2010 |

OTHER PUBLICATIONS

D. Banaszak, et al., "AFWAL-TM-85-256 A-7D Have Bounce, vol. 1: Test Description," Air Force Research Laboratory, Air Force Material Command Wright-Patterson Air Force Base, Dec. 1985, 105 pages.*

P. Sartor, et al., "Bayesian Sensitivity Analysis of Flight Parameters in the Development of a Hard Landing Indication System," Fifth European Workshop on Structural Health Monitoring 2010, DEStech Publications, Inc, 2010, pp. 145-153.*

International Search Report for PCT International Application No. PCT/GB2012/050580 dated Sep. 12, 2012.

Combined Search and Examination Report for Application No. GB1104515.0 dated Jul. 18, 2011.

* cited by examiner

METHOD AND SYSTEM FOR DETERMINING FRICTION COEFFICIENT μ FOR AN AIRCRAFT LANDING EVENT

This application is a U.S. National Phase application of PCT International Application No. PCT/GB2012/050580, filed Mar. 16, 2012, which claims the benefit of GB 1104515.0, filed Mar. 17, 2011.

BACKGROUND TO THE INVENTION

When an aircraft operator reports a suspected hard landing, the aircraft and landing gear manufacturers may be required to analyse the occurrence to determine whether or not the landing gear has been overloaded. However, conservatism exists in the analysis process such that components may be considered overloaded when they have not been.

Should the flight crew suspect a hard landing, they declare a possible hard landing occurrence and a visual inspection of the aircraft landing gear is performed by the maintenance crew of the operator. Neither the subjective assessment by the flight crew nor the visual inspections conducted by the maintenance crew can determine whether the landing gear has suffered an overload. Should the aircraft be grounded because of a suspected overload there are severe economic and/or operational implications for the aircraft operator, however, this is preferable to the aircraft being considered serviceable when actually overloaded due to the safety implications. If the operator suspects there may have been an overload then aircraft flight parameter data (such as aircraft lateral and vertical acceleration, ground speed, pitch and roll angle, aircraft mass and centre of gravity position), is downloaded from the Flight Data Recorder (FDR) and reported to the aircraft and landing gear manufacturers who use dynamic models to assess the loads that the landing gear experienced during the occurrence at spin-up, spring-back and maximum vertical reaction. It is only after this analysis that a decision is made as to whether there has been an overload or not.

For example, critical load cases for the main fitting and sliding tube main landing gear components are the spin-up and spring-back drag axle response loads. The magnitude of these loads is highly dependent on the aircraft vertical acceleration and longitudinal ground-to-tyre friction coefficient, μ. However, vertical acceleration is often sampled at only 8 Hz on some aircraft whilst the critical part of the landing, relevant to whether an overload occurred or not, takes less than 125 ms. Therefore, it is likely that the peak vertical acceleration on the landing impact could be missed. Additionally, since μ is not a measured parameter, the aircraft and landing gear manufacturers use a worst-case assumption value in their analysis process. For some events this leads to unnecessarily conservative dispositions of landing gear components, as well as the attachment structure. Therefore, there is a motivation for implementing improved monitoring methods and techniques to maximize operational availability and minimize costs, whilst maintaining an acceptable level of safety.

SUMMARY OF THE INVENTION

According to a first aspect of the present invention there is provided a method of determining the ground-to-tyre friction coefficient for an aircraft landing event, the method comprising:

providing a plurality of aircraft data parameters including aircraft vertical acceleration to an aircraft computational model and repeatedly modelling the landing event using the aircraft computational model by varying one or more initial conditions of the aircraft model until a best match between a modelled value of aircraft vertical acceleration and the provided value of aircraft vertical acceleration is determined;

providing the aircraft computational model initial conditions associated with the best match of modelled and provided aircraft vertical acceleration values to a landing gear computational model and also providing a strain value derived from a first sensor located on the aircraft landing gear to the landing gear computational model, the landing gear computational model having a value for the ground-to-tyre friction coefficient as a variable condition;

modelling the landing gear to generate a modelled strain value and comparing the modelled strain value with the measured strain value; and repeating the landing gear modelling step with a different value for the ground-to-tyre friction coefficient until a best match between the modelled strain value and the measured strain value is determined and outputting the respective friction coefficient value.

The method may further comprise analysing the output of the landing gear computational model for the determined ground-to-tyre friction coefficient to determine if a landing gear overload occurred during the aircraft landing event.

Additionally or alternatively, at least a portion of the aircraft data parameters may be provided by an aircraft flight data recorder. Additionally, a further portion of the aircraft data parameters may be provided by at least one remote inertial measurement unit located on the landing gear of the aircraft. The at least one remote inertial measurement unit preferably samples the aircraft data parameters at a frequency greater than 8 Hz.

A further input may be provided to the aircraft computational model, the further input being provided by a second sensor located on the aircraft landing gear and arranged to measure a further one of the values modelled by the aircraft computational model other than the aircraft vertical acceleration and wherein the aircraft landing event is repeatedly modelled until a best match of the modelled and measured further values is additionally determined. The further value may comprise the shock absorber travel of the landing gear.

The strain value is preferably indicative of the drag loading of the landing gear.

The first sensor may comprise a strain gauge located on a drag stay on the landing gear.

According to a second aspect of the present invention there is provided a system for determining the ground-to-tyre friction coefficient for an aircraft landing event, the system comprising:

a flight data acquisition system arranged to record a plurality of aircraft data parameters including aircraft vertical acceleration during the landing event;

an aircraft computational model arranged to receive the plurality of aircraft data parameters and to repeatedly model the landing event by varying one or more initial conditions until a best match between a modelled value of aircraft vertical acceleration and the acquired value of aircraft vertical acceleration is determined;

a first sensor located on the aircraft landing gear arranged to generate a strain value during the landing event;

a landing gear computational model having a value for the ground-to-tyre friction coefficient as a variable condition and arranged to:
  receive the aircraft computational model initial conditions associated with the best match of modelled and recorded aircraft vertical acceleration values;
  receive the strain value from the first sensor;
  model the landing gear to generate a modelled strain value and compare the modelled strain value with the measured strain value; and
  repeat the modelling step with a different value for the ground-to-tyre friction coefficient until a best match between the modelled strain value and the measured strain value is determined and outputting the respective friction coefficient value.

The system may further comprise an analysis module to analyse the output of the landing gear computational model for the determined ground-to-tyre friction coefficient to determine if a landing gear overload occurred during the aircraft landing event.

The flight data acquisition system may comprise an aircraft flight data recorder and may additionally comprise at least one remote inertial measurement unit located on the landing gear of the aircraft. the at least one remote inertial measurement unit preferably being arranged to sample the aircraft data parameters at a frequency greater than 8 Hz.

The system may comprise a second sensor located on the aircraft landing gear arranged to measure a further one of the values modelled by the aircraft computational model other than the aircraft vertical acceleration and wherein the aircraft computational model is further arranged to receive an output from the second sensor and repeatedly model the aircraft landing event until a best match of the modelled and measured further values is additionally determined.

The second sensor may be arranged to measure the shock absorber travel of the landing gear.

The strain value may be indicative of the drag loading of the landing gear.

The first sensor may comprise a strain gauge located on a drag stay on the landing gear.

BRIEF DESCRIPTION OF THE DRAWINGS

Embodiments of the present invention will be discussed in more detail below with reference to the accompanying figures, of which.

DESCRIPTION OF EMBODIMENTS OF THE INVENTION

Figure 1:
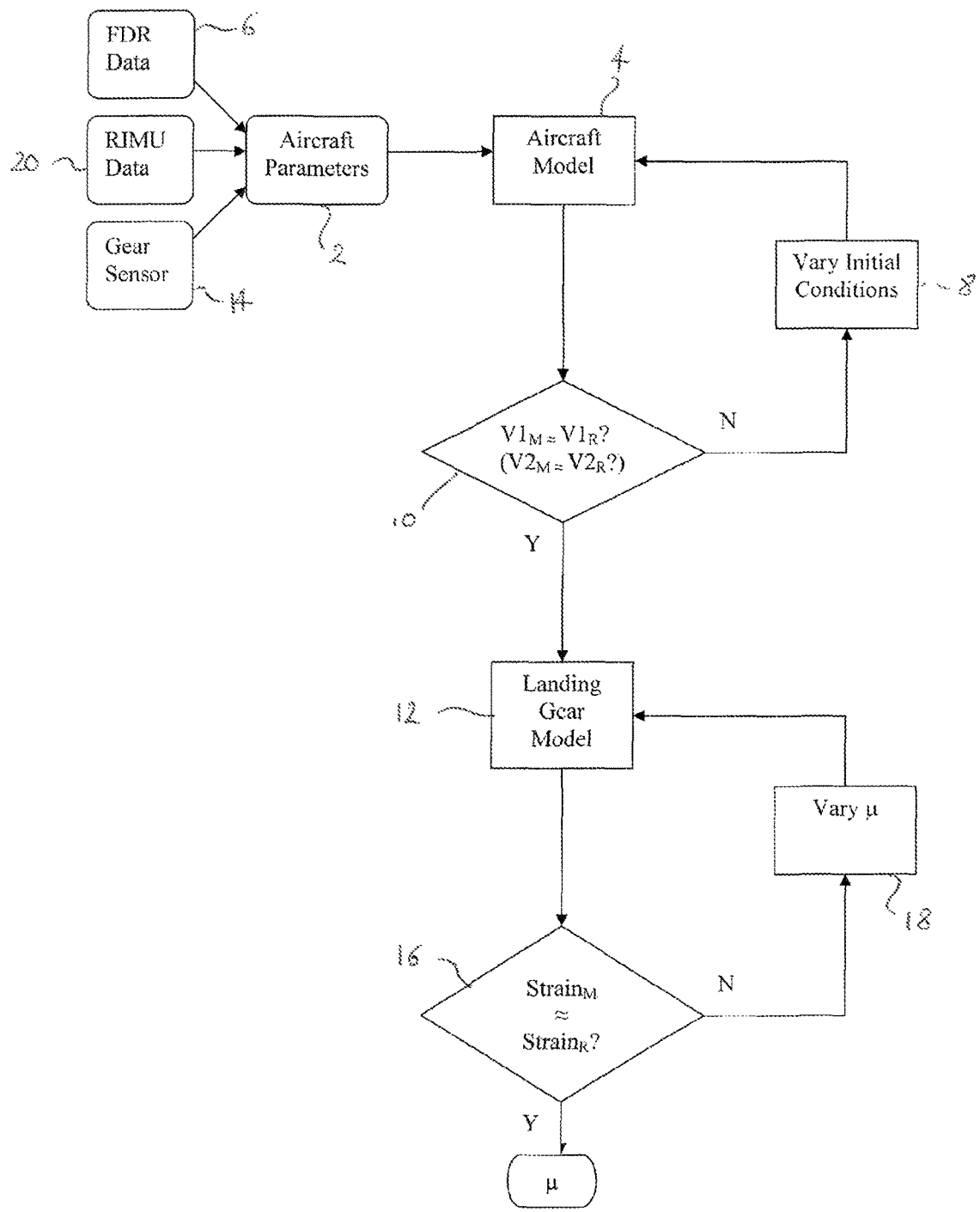
FIG. 1 shows a method of determining $\mu$ according to an embodiment of the present invention.

A method of more accurately determining a value for the ground-to-tyre friction coefficient $\mu$ for an aircraft landing event according to an embodiment of the present invention is represented as a flow chart in FIG. 1. A number of aircraft parameters 2 are provided to the input of an aircraft computational model 4 to define the initial conditions for the model. These parameters include the flight data recorded by an aircraft Flight Data Recorder (FDR) 6 for such flight parameters as aircraft lateral and vertical acceleration, ground speed, pitch and roll angle, aircraft mass and centre of gravity position. The aircraft computational model 4 uses the provided parameters to numerically model the aircraft landing event, providing a simulation of that event and providing various values for modelled flight parameters including a modelled value for the aircraft vertical acceleration. In addition to the initial conditions defined by the Flight Data Recorder data 6, other initial conditions for the aircraft computational model must be set to allow the model to simulate the landing event. One of these further initial conditions is a value of $\mu$ for the friction coefficient between the ground and landing gear tyre. At this point a true value for $\mu$ is not known, so an assumed value is set. The assumed value may be a generalised value or may be estimated based on the known runway conditions at the time of the landing event being simulated. However, it is important to note that at this point on the method the true value of $\mu$ is not known.

The value for the aircraft vertical acceleration generated by the aircraft model 4 is compared to the actual value of vertical acceleration provided by the FDR. If the two values do not match then one or more of the initial conditions for the aircraft computational model is varied 8 and the landing event modelled again. This process is iterated until the closest match of modelled value and actual value for the aircraft vertical acceleration is achieved (step 10). The set of initial conditions providing the closest match to the actual landing event are provided as an output from the aircraft computational model.

The initial conditions output from the aircraft model are provided as input initial conditions to a landing gear computational model 12 that is arranged to model the specific behaviour of a specified landing gear during the landing event, including the loads, strains and movement/deformation of the landing gear. The initial conditions include the assumed value for the ground-to-tyre friction coefficient $\mu$. Of particular interest for determining if the landing gear has been critically overloaded during a hard landing event are the loads experienced by the main gear components during spin-up and spring-back. Spin-up is a term of the art for the period of time commencing when the landing gear tyre first comes into contact with the runway surface and accelerates from rest to full rotational speed. During this period the landing gear experiences a lateral drag loading, i.e. the gear experiences a bending force towards the rear of the aircraft. Spring-back is the corresponding term for the period during which the drag loading is removed as the tyre attains full rotational speed. As previously noted, the magnitude of these loads is highly dependent on the aircraft vertical acceleration and the ground-to-tyre friction coefficient $\mu$. The landing gear computational model takes the initial conditions output from the aircraft computational method to simulate the loads experienced by the particular landing gear during the landing event, including the lateral drag loading during spin-up and spring-back. A further initial condition is a value for the friction coefficient $\mu$, which for the first modelling is taken as the assumed value of $\mu$ used previously by the aircraft computational model. In embodiments of the present invention one or more sensors are located on the actual aircraft landing gear to allow a measured value of the drag loading to be derived. For example, a strain gauge may be located on the drag stay of the gear to measure a strain value 14 experienced by the landing gear. The loads experienced by the landing gear are repeatedly modelled, with the initial value for the friction coefficient $\mu$ varied at each repetition (step 18), until the measured strain value from the landing gear best matches the corresponding value determined by the landing gear computational model (step 16). By matching the measured and modelled strain values a more accurate value for μ is determined. The output from the best matching gear model will be the dynamic axle response loads at spin-up and spring-back, together with the internal pressures within the gear shock absorber, and may be subsequently used to perform a structural disposition analysis process for the landing gear to determine if any overload conditions occurred.

As previously mentioned, the known flight data recorders tend to sample their measured flight parameters at a relatively low frequency, typically 8 Hz. However, the spin-up and spring-back events typically take place over a time period of less than $\frac{1}{8}^{th}$ of a second and consequently the peak value for vertical acceleration may be not be recorded by the FDR unit, leading to inaccuracies in the subsequently modelled landing event generated by the aircraft computational model. To reduce these inaccuracies, in some embodiments of the present invention an additional data parameter acquisition system is employed that is arranged to record flight data parameters at a greater frequency than the known FDR's. For example, one or more remote inertial measurement units that are arranged to record high rate accelerations and roll rates in three dimensions may be located on the landing gear structure. The data 20 from the RIMUs are also provided to the aircraft computational model to increase the accuracy of the model output.

To further increase the accuracy of the aircraft modelling stage one or more further parameters of the landing gear may be measured and compared with the corresponding model output value together with the vertical acceleration values when determining the best match of model output values with the recorded data parameters. One such suitable further parameter is the shock absorber travel, which can, for example, be measured using a rotary variable displacement transducer located at the most suitable point on the landing gear depending on the gear design.

Figure 2:
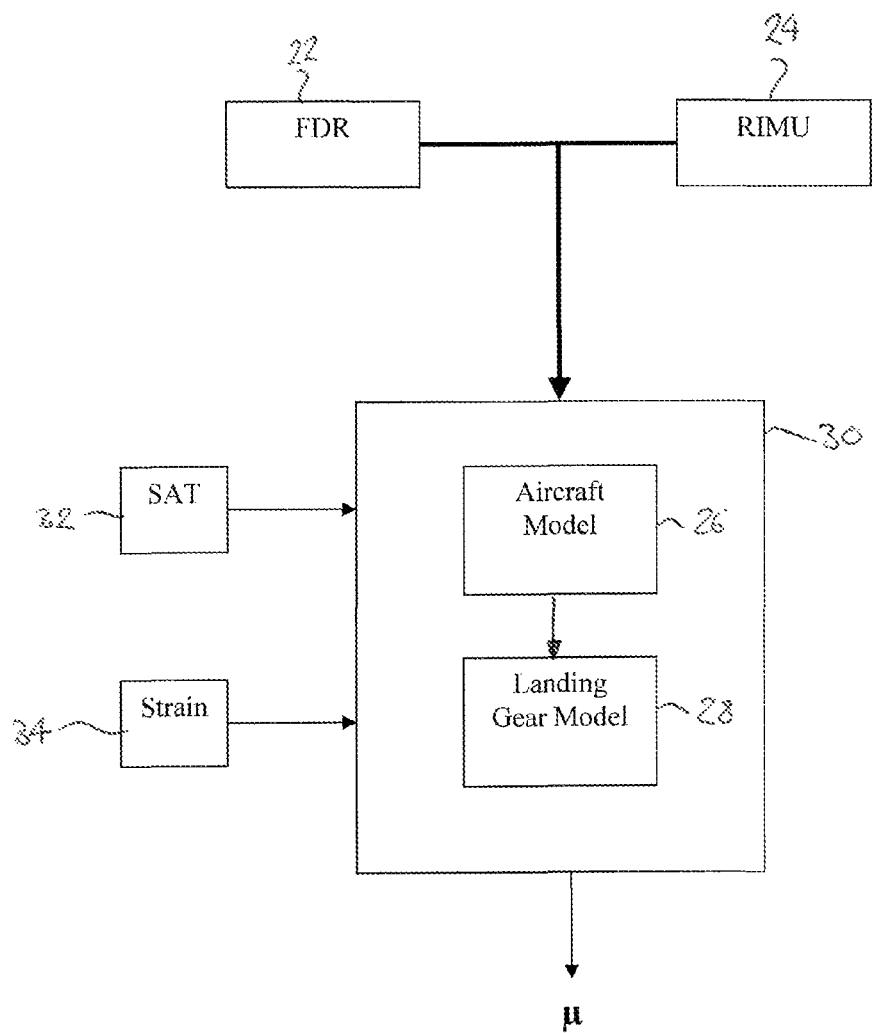
FIG. 2 shows a block diagram of a system for determining $\mu$ according to an embodiment of the present invention.
Figure 3:
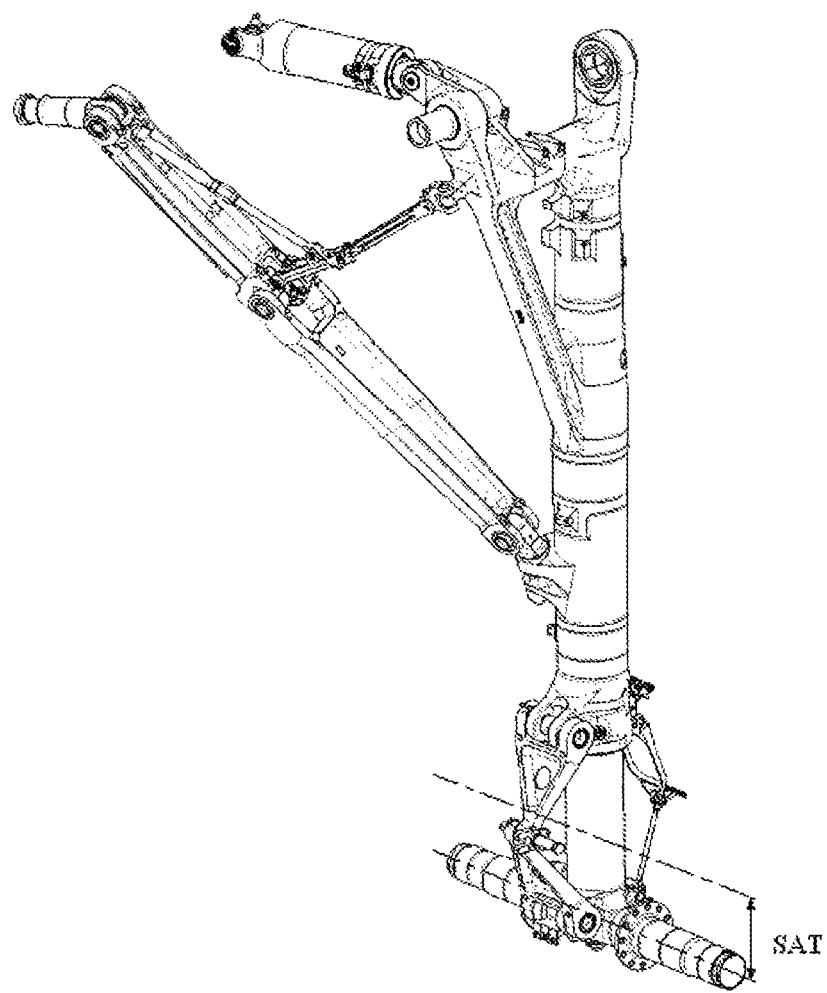
FIG. 3 shows an aircraft landing gear having additional sensors fitted according to embodiments of the present invention.

A suitable system for implementing embodiments of the present invention is shown in FIG. 2. The outputs from the Flight Data Recorder (FDR) 22, and where fitted, the Remote Inertial Measurement Units (RIMU) 24 are provided to an aircraft computational model 26, the outputs from which are provided to a landing gear computational model 28. In the illustrated system the two computational models comprise a single a data processor 30, which will typically be located remote from the aircraft in question, such as at the landing gear manufacturers premises. However, the data processor may be located on the aircraft. Equally separate data processors may be provided for each model. The outputs from the one or more sensors 32,34 located on the landing gear are also provided to the respective computational models. FIG. 3 illustrates an example main landing gear structure having a strain gauge located on the drag stay and a sensor to measure the shock absorber travel, indicated by the double headed arrow.

The invention claimed is:

1. A method of determining a ground-to-tyre friction coefficient for an aircraft landing event of an aircraft landing gear, the method comprising:
providing a plurality of aircraft data parameters including a provided aircraft vertical acceleration to an aircraft computational model and repeatedly modelling the aircraft landing event using the aircraft computational model by varying one or more initial conditions of the aircraft computational model until a best match between a modelled value of aircraft vertical acceleration and the provided aircraft vertical acceleration is determined;
providing the aircraft computational model initial conditions associated with the best match of modelled and provided aircraft vertical acceleration values to a landing gear computational model and also providing a measured strain value derived from a first sensor located on the aircraft landing gear to the landing gear computational model, the landing gear computational model having a value for the ground-to-tyre friction coefficient as a variable condition;
modelling the aircraft landing gear to generate a modelled strain value and comparing the modelled strain value with the measured strain value;
repeating the landing gear modelling step with a different value for the ground-to-tyre friction coefficient until a best match between the modelled strain value and the measured strain value is determined and outputting the respective friction coefficient value; and
analysing an output of the landing gear computational model for the determined ground-to-tyre friction coefficient to determine if a landing gear overload occurred during the aircraft landing event.

2. The method of claim 1, wherein at least a portion of the aircraft data parameters are provided by an aircraft flight data recorder.

3. The method of claim 2, wherein a further portion of the aircraft data parameters are provided by at least one remote inertial measurement unit located on the landing gear of the aircraft.

4. The method of claim 3, wherein the at least one remote inertial measurement unit samples the aircraft data parameters at a frequency greater than 8 Hz.

5. The method of claim 1, wherein a further input is provided to the aircraft computational model, the further input being provided by a second sensor located on the aircraft landing gear and arranged to measure a further one of the values modelled by the aircraft computational model other than the aircraft vertical acceleration and wherein the aircraft landing event is repeatedly modelled until a best match of the modelled and measured further values is additionally determined.

6. The method of claim 5, wherein the further value comprises a shock absorber travel of the landing gear.

7. The method of claim 1, wherein the strain value is indicative of a drag loading of the landing gear.

8. The method of claim 7, wherein the first sensor comprises a strain gauge located on a drag stay on the landing gear.

9. A system for determining a ground-to-tyre friction coefficient for an aircraft landing event of an aircraft landing gear, the system comprising:
a flight data acquisition system arranged to record a plurality of aircraft data parameters including an acquired aircraft vertical acceleration during the aircraft landing event;
an aircraft computational model arranged to receive the plurality of aircraft data parameters and to repeatedly model the aircraft landing event by varying one or more initial conditions until a best match between a modelled value of aircraft vertical acceleration and the acquired value of aircraft vertical acceleration is determined;
a first sensor located on the aircraft landing gear arranged to generate a measured strain value during the aircraft landing event;
a landing gear computational model having a value for the ground-to-tyre friction coefficient as a variable condition and arranged to:

receive the aircraft computational model initial conditions associated with the best match of modelled and acquired aircraft vertical acceleration values;

receive the measured strain value from the first sensor;

model the landing gear to generate a modelled strain value and compare the modelled strain value with the measured strain value; and repeat the modelling step with a different value for the ground-to-tyre friction coefficient until a best match between the modelled strain value and the measured strain value is determined and outputting the respective friction coefficient value; and an analysis module to analyse an output of the landing gear computational model for the determined ground-to-tyre friction coefficient to determine if a landing gear overload occurred during the aircraft landing event.

10. The system of claim 9, wherein flight data acquisition system comprises an aircraft flight data recorder.

11. The system of claim 10, wherein the flight data acquisition system further comprises at least one remote inertial measurement unit located on the landing gear of the aircraft.

12. The system of claim 11, wherein the at least one remote inertial measurement unit samples the aircraft data parameters at a frequency greater than 8 Hz.

13. The system of claim 9, further comprising a second sensor located on the aircraft landing gear arranged to measure a further one of the values modelled by the aircraft computational model other than the aircraft vertical acceleration and wherein the aircraft computational model is further arranged to receive an output from the second sensor and repeatedly model the aircraft landing event until a best match of the modelled and measured further values is additionally determined.

14. The system of claim 13, wherein the second sensor is arranged to measure a shock absorber travel of the landing gear.

15. The system of claim 9, wherein the strain value is indicative of a drag loading of the landing gear.

16. The system of claim 15, wherein the first sensor comprises a strain gauge located on a drag stay on the landing gear.

* * * * *